(12) United States Patent
Pettygrove et al.

(10) Patent No.: US 12,288,922 B2
(45) Date of Patent: Apr. 29, 2025

(54) ANTENNA FINE TUNING WITH A VOLTMETER ASSOCIATED WITH AN ANTENNA ALIGNMENT DEVICE

(71) Applicant: Viavi Solutions Inc., San Jose, CA (US)

(72) Inventors: Scott Pettygrove, Leesburg, VA (US); Raleigh Benton Stelle, IV, Indianapolis, IN (US); Eduardo Aries, Hollywood, FL (US)

(73) Assignee: Viavi Solutions Inc., San Jose, CA (US)

(*) Notice: Subject to any disclaimer, the term of this patent is extended or adjusted under 35 U.S.C. 154(b) by 336 days.

(21) Appl. No.: 17/805,609

(22) Filed: Jun. 6, 2022

(65) Prior Publication Data
US 2023/0395965 A1 Dec. 7, 2023

(51) Int. Cl.
*H01Q 1/12* (2006.01)
*G01R 19/25* (2006.01)
*H01Q 3/08* (2006.01)

(52) U.S. Cl.
CPC ....... *H01Q 1/1257* (2013.01); *G01R 19/2506* (2013.01); *H01Q 3/08* (2013.01)

(58) Field of Classification Search
CPC ..... H01Q 1/1257; H01Q 3/08; G01R 19/2506
USPC ........................................................ 342/174
See application file for complete search history.

(56) References Cited

U.S. PATENT DOCUMENTS

| | | | | |
|---|---|---|---|---|
| 6,956,526 B1* | 10/2005 | Lundstedt, Jr | ........... | H01Q 3/08 342/359 |
| 2002/0057225 A1* | 5/2002 | Spirtus | ................. | H01Q 1/1257 343/757 |
| 2010/0167675 A1* | 7/2010 | Zhao | .................... | H01Q 1/1257 455/226.2 |
| 2013/0099972 A1* | 4/2013 | Yun | .................... | H01Q 13/0275 342/368 |
| 2014/0043181 A1* | 2/2014 | Vilhar | .................... | H04B 17/23 343/703 |

(Continued)

OTHER PUBLICATIONS

Foegelle. "Antenna Pattern Measurement: Concepts and Techniques," Compliance Engineering, Annual Reference Guide 2002 • Copyright © 2002 Canon Communications, pp. 1-12 (Year: 2002).*

(Continued)

*Primary Examiner* — James R Hulka
*Assistant Examiner* — Samarina Makhdoom
(74) *Attorney, Agent, or Firm* — DLA Piper LLP (US)

(57) ABSTRACT

An antenna alignment device includes an embedded (or is connected to) direct current (DC) voltmeter. In addition to using different sensors for azimuth and tilt alignment of an antenna, the DC voltmeter may be used to measure the DC voltage indicative of received signal strength at the antenna. The received signal may have a transmission pattern generated by a far side antenna. Particularly, the DC voltmeter may be used to detect peaks in the DC voltage and count the number of detected peaks as the antenna is moved changing its azimuth and the tilt. An odd number of peaks indicates the boresight of the antenna is in the main lobe of the transmission pattern, and an even number of peaks indicates otherwise. The highest peak in the odd number of peaks corresponds to the main lobe and the boresight of the antenna is aligned/tuned toward the highest peak.

20 Claims, 6 Drawing Sheets

(56) References Cited

U.S. PATENT DOCUMENTS

2020/0395996 A1* 12/2020 Nakayama ............. H01Q 21/24

OTHER PUBLICATIONS

Cisco. "Antenna Patterns and Their Meaning," 1992-2007 Cisco Systems, Inc, C11-422494-00 Aug. 2007 (Year: 2007).*

* cited by examiner

300

ANTENNA FINE TUNING WITH A VOLTMETER ASSOCIATED WITH AN ANTENNA ALIGNMENT DEVICE

BACKGROUND

Modern communication systems rely heavily on wireless signals transmitted and received by antennas. On the transmit side, antennas receive fluctuating electrical currents through wires from connected circuitry and generate wireless signals as electromagnetic fields corresponding to the fluctuating electrical currents. On the receive side, antennas convert electromagnetic fields of the received wireless signals to electrical currents carried through wires to the connected circuitry. Because of directional oscillation of electrical and magnetic fields, wireless signaling through the transmittal and receipt of electfromagnetic fields is inherently directional: heavily influenced by the location of the signal source, multipathing, beamforming, and or other aspects associated with electromagnetic fields and electromagnetic radiation. Antenna alignment may therefore be desired for optimizing bandwidth, signal strength, and or other transmit/receive parameters. Antenna alignment may generally be performed using antenna alignment devices.

Conventional antenna alignment devices, however, have several technical shortcomings when applied to point-to-point wireless networks. For instance, conventional antenna alignment devices may just provide azimuth and tilt readings, generally used for a "coarse" antenna alignment. A "fine" antenna alignment—to ensure that the boresight of the antenna is oriented towards the main transmission lobe of a far-end link—is a separate activity, performed using an external, shielded direct current (DC) voltmeter. Using a voltmeter requires a technician to recall the number and magnitude of the DC voltage peaks as he/she traverses the antenna left/right and up/down to find a peak signal and also to ensure that the peak signal is not a secondary lobe. This overly manual process is cumbersome and prone to errors. Furthermore, the manual process does not provide an automated storage of the optimal alignment parameters (e.g., tilt, azimuth). A technician, often at high and inconvenient positions, may not be able to manually record and store these values.

The technical shortcomings of the conventional antenna alignment devices are particularly problematic for microwave antennas often used on cell towers. These antennas require finer alignment because of the large signal population hitting the cell tower and low inter-band separation between different channels.

As such, a significant improvement upon antenna alignment devices, particularly for a fine antenna alignment is desired.

SUMMARY

Embodiments disclosed herein attempt to solve the aforementioned and other technical problems and may provide other solutions as well. An antenna alignment device according to the disclosed principles includes an embedded, or is otherwise connected to, direct current (DC) voltmeter. Therefore, in addition to using different sensors for azimuth and tilt alignment of an antenna, the DC voltmeter may be used to measure the DC voltage indicative of received signal strength at the antenna. The received signal may have a transmission pattern generated by a far side antenna. Particularly, the DC voltmeter may be used to detect peaks in the DC voltage and count the number of detected peaks as the antenna is moved changing its tilt and azimuth. An odd number of peaks when traversing the antenna radiation pattern indicates the boresight of the antenna crossed the main lobe of the transmission pattern during the traversal, and an even number of peaks indicates otherwise. The highest peak in the odd number of peaks corresponds to the main lobe and the boresight of the antenna is aligned (also referred to as tuned) toward the highest peak. Alternatives to using the DC voltmeter include acquiring real-time received signal strength information from any other device. For example, the antenna itself may wirelessly provide the received signal strength information as it is being moved, and the signal strength information may be used for the alignment.

In an embodiment, an antenna alignment device configured to be coupled to an antenna for aligning the antenna is provided. The antenna alignment device may include a first set of sensors configured to generate an azimuth alignment coarse parameter and a second set of sensors configured to generate a tilt alignment coarse parameter. The antenna alignment device may further include a direct current (DC) voltmeter configured to trace DC voltages indicative of a received signal strength at the antenna and generate an azimuth alignment fine parameter and a tilt alignment fine parameter.

In another embodiment, a method of aligning an antenna with an antenna alignment device is provided. The method may include coarsely aligning an azimuth of the antenna using a first set of sensors in the antenna alignment device and coarsely aligning a tit of the antenna using a second set of sensors in the antenna alignment device. The method may further include finely aligning the azimuth and the tilt using a direct current (DC) voltmeter that traces DC voltages indicative of a received signal strength at the antenna and generate an azimuth alignment fine parameter and a tilt alignment fine parameter.

In yet another embodiment, an antenna alignment system is provided. The antenna alignment system may include an antenna alignment device and a direct current (DC) voltmeter. The antenna alignment device may include a first set of sensors configured to generate an azimuth alignment coarse parameter and a second set of sensors configured to generate a tilt alignment coarse parameter. The DC voltmeter may be configured to measure DC voltages indicative of a received signal strength at the antenna. The antenna alignment device may be configured to receive the measured DC voltages from the DC voltmeter and generate an azimuth alignment fine parameter and a tilt alignment fine parameter based on the measured DC voltages.

DETAILED DESCRIPTION OF SEVERAL EMBODIMENTS

Embodiments disclosed herein describe antenna alignment devices that may be used to finely align (or tune) an antenna for its boresight to be at the main lobe of a transmission pattern of a far side antenna. The terms "align/aligning" and "tune/tuning" have been used interchangeably throughout this disclosure. Furthermore, aligning/tuning an antenna to be at the main lobe of transmission pattern should be understood to be aligning the boresight of the antenna to the main lobe. In addition to the coarse alignment provided by azimuth and tilt sensors, an embedded (or connected to the antenna alignment device) DC voltmeter may facilitate a fine alignment of the antenna. Particularly, the DC voltmeter may measure the voltage indicative of a received signal strength at the antenna as the antenna is moved between, e.g., left and right and or top and bottom positions. The measurement trace may be used to count the number of peaks, with the odd number of peaks indicating that the highest peak—among the odd number of peaks—is the main lobe of the transmission pattern of the far side antenna. Using the voltage measurement traces for the azimuth and or the tilt, the boresight of the antenna may be centered to the main lobe of the radiation pattern.

The voltage measurement traces along with the location (of the peaks (e.g., along with the corresponding azimuth/tilt values of the peaks) may be stored by the antenna alignment device for future retrieval. Alternatively or additionally, this data may be sent to an external processing device (e.g., a mobile phone carried by a technician, a cloud computing device, etc.). Furthermore, the antenna alignment device may automatically detect the peaks in the traces and further indicate the peak detection on one or more devices. For example, the antenna alignment device may generate audio feedback or haptic feedback when a peak is detected.

Figure 1:
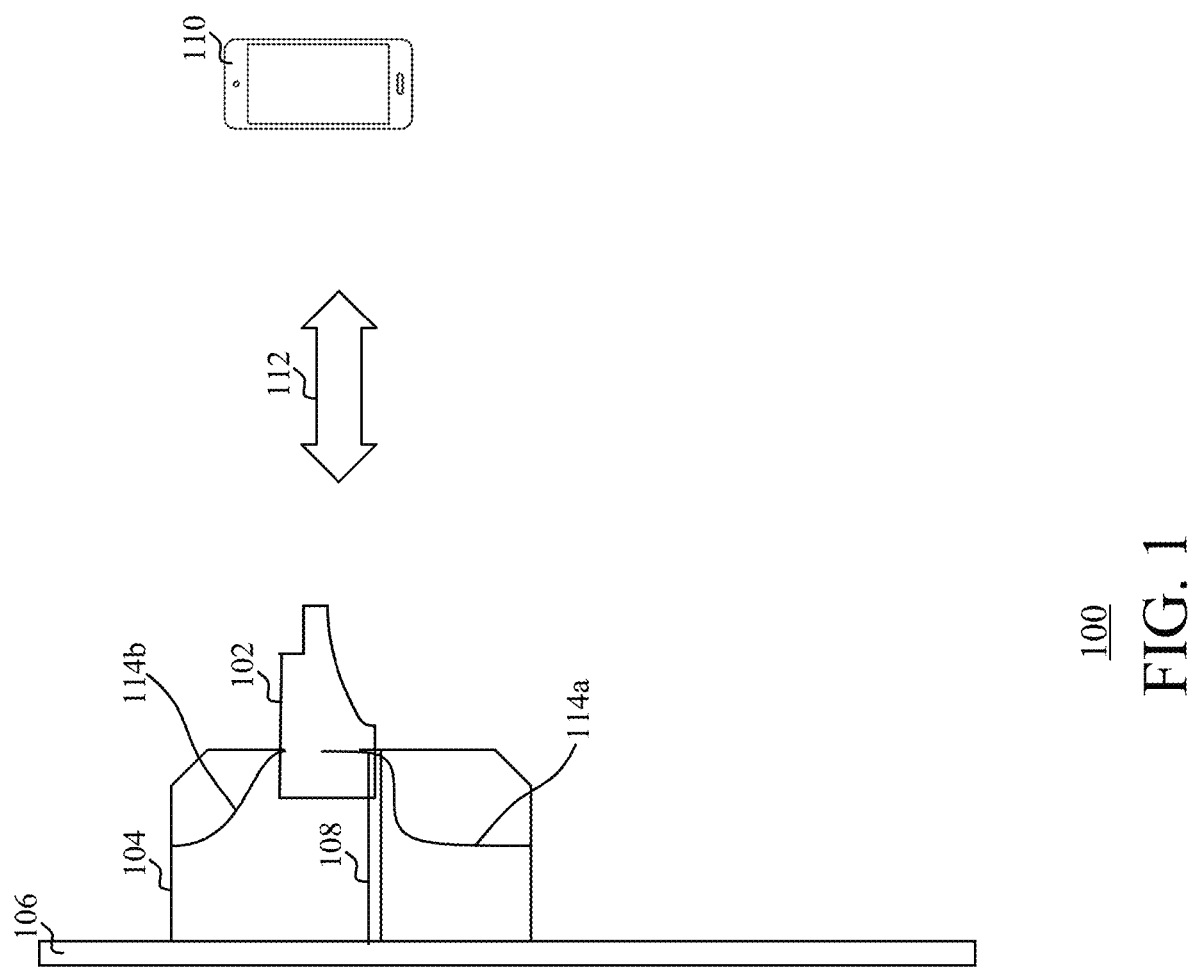
FIG. 1 shows an example antenna alignment environment based on the principles disclosed herein.

FIG. 1 shows an example antenna alignment (also referred to as antenna tuning) environment 100, based on the principles disclosed herein. The example environment 100 includes an antenna 104, which may be disposed on a pole 106. The pole 106 is just an example, and the antenna 104 may be located on any type of structure such as an antenna tower, rooftop, treetop, building wall, vehicle top, satellite, and/or any other type of structure. Furthermore, the antenna 104 can be any type of antenna, including a dome antenna, loop antenna, Yagi-type antenna, and or any type of antenna that may have to be finely aligned (or tuned) for optimal performance. Although the antenna 104 is described herein as a singular antenna, a combination of antennas that may have to be aligned should also be considered within the scope of this disclosure. The antenna 104 may use any kind of transmit/receive frequency, e.g., the antenna 104 may be a microwave antenna used in a cellular communications tower.

An antenna alignment device 102 may be attached to the antenna 104 using a coupler 108. The antenna alignment device 102 may include any type of sensors, displays, voltmeters and/or other components configured to align (or tune) the antenna 104. When coupled to the antenna 104, the orientation of the antenna alignment device 102 may correspond to the orientation of the antenna 104. The alignment may include parameters such as roll, pitch (also referred to as tilt), or azimuth (referred herein as coarse alignment parameters); as understood in the art. The alignment parameters may further include orientation/alignment (referred herein as a fine alignment) of the boresight of the antenna 104 towards the main transmission lobe of the far-side link (e.g., main transmission lobe of a signal transmitted by a far-side antenna).

In operation, the antenna alignment device 102 may use sensors such as magnetometers, accelerometers and or global navigation satellite system (GNSS) receivers for aiding in the coarse alignment of the antenna 104. For instance, the coarse alignment may include aligning the antenna to have a desired roll, pitch and or azimuth. A display in the antenna alignment device 102 may show the roll, pitch, and or the azimuth as the antenna is being aligned. In addition, the fine alignment may include orienting the boresight of the antenna 104 at the main transmission lobe of a far-link. A DC voltmeter (see FIG. 2) within the antenna alignment device 102 (or connected with the antenna alignment device 102) may be used to measure the DC voltage indicative of the received signal (e.g., from a far-side antenna) strength at the antenna 104 to determine the peaks of the DC voltage as the antenna 104 is moved. For example, the antenna alignment device 102 may include wires 114a, 114b that may be connected to the ports of a device (not shown) attached to the antenna 104 that may generate the DC voltage signal with a reading/strength corresponding to the received signal strength—and the voltmeter in the antenna alignment device 102 may measure the output DC voltage signal antenna using these wires 114a, 114b.

The measurement of the DC voltage may be displayed on the screen of the antenna alignment device 102. This measurement may be displayed as a trace of the voltage measurement across an alignment spectrum. For example, the antenna 104 after a coarse alignment may be moved in an azimuth (i.e., within the fine alignment range). The measurement therefore may be trace of the DC voltage in the azimuth range. In other embodiments, the measurement of the DC voltage may be provided to external processing device 110 (e.g., a smartphone) through a local wired or wireless communication link 112.

Therefore, within the example environment 100, a technician may use the antenna alignment device to trace the DC voltage indicative of the received signal strength at the antenna 104 and locate the main transmission lobe of a far side link (i.e., the main transmission lobe is within a radiation pattern of a far side second antenna). The trace may be displayed on the screen of the antenna alignment device 102 and or on the display of the external processing device 110. Using the trace, the technician may finely align the antenna 104 such that the boresight of the antenna is on the main transmission lobe.

It should however be understood that using a DC voltmeter (either embedded or external) is just but an example; and acquiring any type of received signal strength measurement should be considered within the scope of this disclosure. For example, the antenna 104 itself may provide a signal (not to be confused with the communication signal between the antenna 104 and a far side antenna) indicating the received signal strength to the antenna alignment device 102 as the antenna 104 is being moved. The signal may be through a wireless communication protocol (e.g., Wifi, Bluetooth, etc.) and may be in real time. The antenna alignment device 102 may track this signal (e.g., using communication interface 218 in FIG. 2) from the antenna (and or any other source) to detect and or indicate the position of the antenna 104 that corresponds to the maximum received signal strength.

Figure 2:
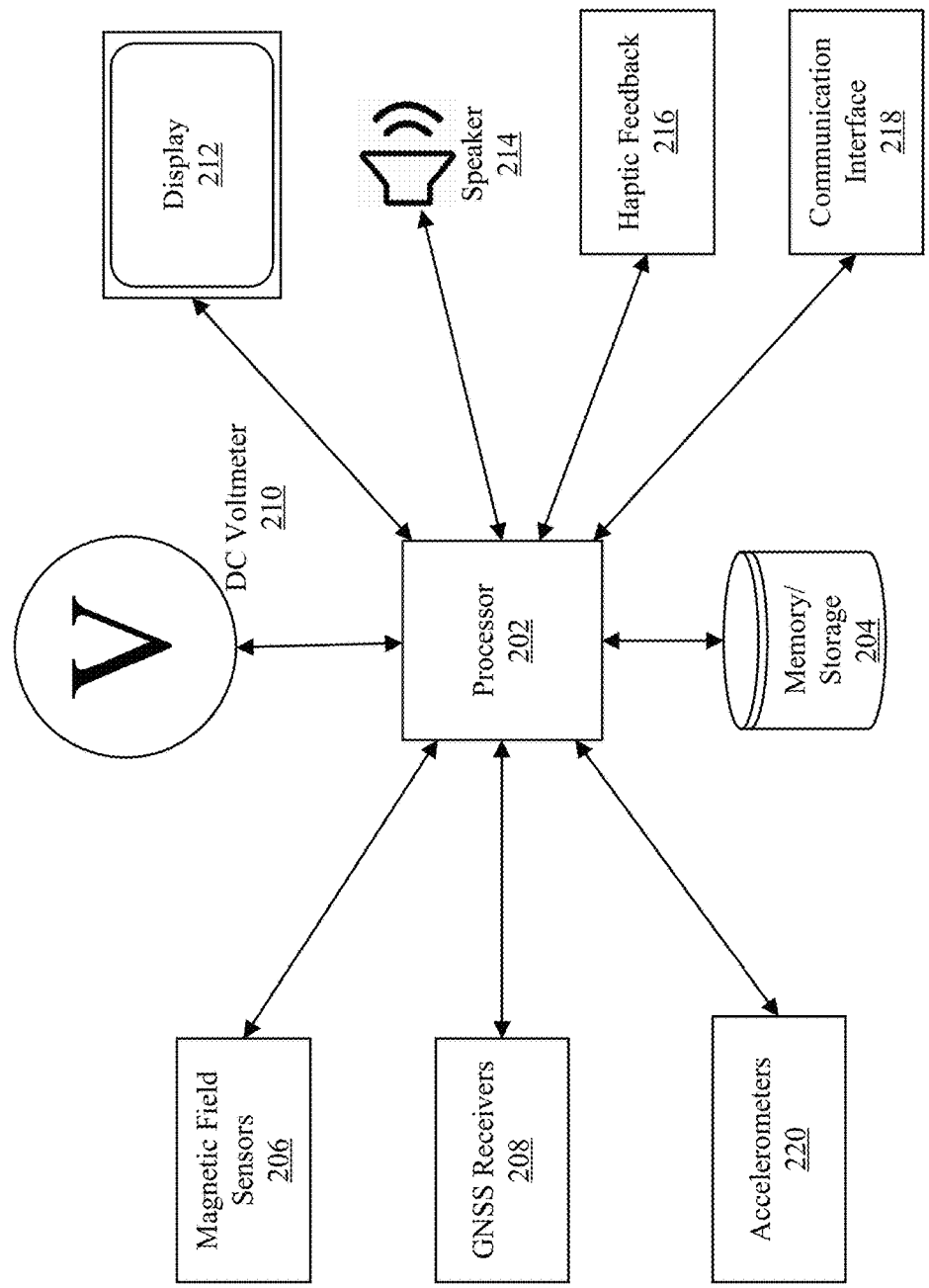
FIG. 2 shows an example architecture of an antenna alignment device based on the principles disclosed herein.

FIG. 2 shows an example architecture 200 of an antenna alignment device based on the principles disclosed herein. As shown, components in the architecture 200 may include, for example, a processor 202, a memory/storage device 204, magnetic field sensors (also referred to as magnetometers) 206, GNSS receivers 208, accelerometers 220, a DC voltmeter 210, a display 212, a speaker 214, a haptic feedback module 216, and a communication interface 218. It should, however, be understood that these components are merely examples and architectures with additional, alternative, or fewer number of components should be considered within the scope of this disclosure. As described herein, the components forming the architecture 200 may be used by the antenna alignment device for aligning (or tuning) a connected antenna.

The processor 202 may include any kind of processing or control device that may command and control the several functionalities of the antenna alignment device. To that end, the processor may execute instructions in the memory/storage device 204 to communicate with, provide instructions to, and receive data from the other components of the antenna alignment device. Some examples of the processor 202 may include a microprocessor, a system on a chip, an application specific integrated circuit (ASIC), a controller, and the like.

The memory/storage device 204 may include any kind of computer readable storage medium. The memory/storage device 204 may store instructions for the processor 202 to execute and data gathered from the other components in the architecture. The memory/storage device 204 should be understood to include any type of temporary or long-term storage. For instance, the memory/storage 204 may include a random access memory (RAM), a solid state drive, a hard drive, and or any other type of memory/storage technology.

The magnetic field sensors 206 may include any type of sensor that may measure the earth's magnetic field at a corresponding location. The magnetic field sensors 206 may use any kind of measuring technology such as e.g., the Hall effect. The measuring technology may further include measuring effects of the earth's magnetic field on resistance and/or on an electric current moving through a circuit. Regardless of the measurement technology, the magnetic sensors 206 may generate a vector measurement of the earth's magnetic field. The vector measurement may be in a Cartesian system, with the X direction being parallel to earth's magnetic north-south axis, the Y-direction being in the earth's east-west axis, and the Z-direction being perpendicular to the plane of the surface of the earth. The measured earth's magnetic field vector B may therefore have corresponding intensities in each of the above three directions. The scalar magnitude of this vector measurement (i.e., square root of $(X^2+Y^2+Z^2)$, which may be measured in Gauss or Tesla, may be referred to as total intensity of the magnetic field vector B. Other parameters such as inclination and inclination, may be calculated through the orthogonal X, Y, Z components of the field vector B. The magnetic field sensors 206 may provide these measurements to the processor 202. An antenna alignment device may comprise one or multiple magnetic field sensors 206.

The processor 202 may calculate the average of the measurements to determine, e.g., the azimuth of the antenna. The azimuth, which may form a coarse alignment parameter, may indicate the orientation of the antenna in relation to the magnetic axis (e.g., magnetic north and south) of the earth. The processor 202 may then offset the azimuth calculation using predetermined values to calculate the azimuth of the antenna with respect to the geographic axis of the earth. The predetermined values may be stored in the memory/storage device 204 as a lookup table as magnetic azimuth-geographic azimuth pairs.

The GNSS receivers 208 may communicate with GNSS satellites to calculate the corresponding positions of the GNSS receivers. More particularly, the GNSS receivers 208 may receive GNSS signals broadcasted by the GNSS satellites, and use the attributes of the signal (e.g., time of the broadcast embedded in the GNSS signals) to geolocate themselves. Geolocating may include determining latitude, longitude, altitude, and/or other attributes associated with determining the corresponding geolocations. When multiple GNSS receivers 208 determine their geolocations, the processor 202 may use these geolocations to determine positional parameters of the antenna alignment device, such as its azimuth. In some embodiments, the processor 202 may use the geolocations as a redundancy check on the calculated alignment parameters (e.g., azimuth). In other embodiments, the processor 202 may perform a "hybrid" calculation using the data from both the magnetic field sensors 206 and GNSS receivers 208. Regardless of the calculation of the azimuth, it is considered a coarse alignment parameter before the antenna is finely aligned using voltage traced by an embedded (or a connected) DC voltmeter.

Accelerometers 220 may generate another type of coarse alignment parameter. For example, the accelerometers 220 may measure the tilt and or roll of the antenna, which may be used to align the antenna until a desired tilt or roll is reached. Although multiple accelerometers 220 have been described, embodiments with a single accelerometer should be considered within the scope of this disclosure.

A DC voltmeter 210 may be used to measure the DC voltage indicative of received signal strength at the antenna. There may be two ports for the wires connecting to a device (attached to the antenna) that may generate a DC voltage output signal with reading/strength corresponding to the received signal strength, and the DC voltmeter 210 may measure the DC voltage output signal through the connected wires. Particularly, as the antenna and antenna alignment device are being moved (e.g., left/right, up/down), the DC voltmeter 210 may continuously measure/monitor the DC voltage. It is known that the DC voltage peaks at the transmission lobes of a far-end link. Counting of the number of detected DC voltage peaks may allow a technician to confirm that the boresight of the antenna is oriented towards the main transmission lobe of the far-side antenna. If an even number of DC voltage peaks are counted, then the boresight of the antenna may not necessarily be oriented towards the main transmission lobe of the far-side antenna. If, however, an odd number of DC voltage peaks are counted, the central peak may correspond to the main transmission lobe of the far-side antenna.

In some embodiments, the DC voltmeter 210 may be embedded within the antenna alignment device (e.g., within the housing of the antenna alignment device). In other embodiments, the DC voltmeter 210 may be connected to the antenna alignment device through a wireless communication protocol such as Bluetooth, IP, and the like. In these embodiments the DC voltmeter may measure the DC voltages on the antenna and transmit the measured DC voltages to the antenna alignment device through the wireless communication protocol. It should also be understood that the DC voltmeter 210 may be connected to the antenna alignment device through a wired connection. Therefore, the embodiments disclosed throughout this disclosure should be understood to be applicable to an embedded DC voltmeter or a DC voltmeter connected (wirelessly and or with a wired connection) to the antenna alignment device.

The DC voltmeter 210 may therefore generate fine alignment parameters. For instance, the fine alignment parameter may include an azimuth that corresponds to the boresight being oriented toward the main transmission lobe. As another example, the fine alignment parameter may include a tilt that also corresponds to the boresight being oriented toward the main transmission lobe.

It should however be understood that using the DC voltmeter 210 (either embedded or external) is just but an example; and acquiring any type of received signal strength measurement should be considered within the scope of this disclosure. For example, the antenna itself may provide a signal (not to be confused with the communication signal between the antenna and a far side antenna) indicating the received signal strength to the antenna alignment device as the antenna is being moved. The signal may be through a wireless communication protocol (e.g., Wifi, Bluetooth, etc.) and may be in real time. The antenna alignment device may use the communication interface 218 to retrieve the signal that indicates the maximum received signal strength. This received signal strength may then be used for aligning the antenna with parameters that correspond to a maximum received signal strength.

The display 212 may include any kind of display in the antenna alignment device. The display 212 may include, for example, a liquid crystal display (LCD), a light emitting diode (LED) display, a plasma display, and or any other type of display that may be a part of the antenna alignment device. The display 212 may show multiple alignment parameters, e.g., coarse alignment parameters and fine alignment parameters. For instance, the display 212 may show the change in tilt, azimuth, and or roll of the antenna as the antenna is moved. Using the display 212, a technician may determine whether the antenna has the desired coarse alignment parameters such as azimuth, roll, and or tilt. The display may further show the fine alignment parameters such as the DC voltage measurements, indicative of the received signal strength, as the antenna is moved left/right and up/down. The display 212 may therefore allow a technical to view—in real time—the antenna alignment parameters as the antenna is moved.

The speaker 214 may provide audible feedback to the technician based on one or more alignment parameters. For example, the processor 202 may determine, based on counting the number of DC voltage peaks that have been traversed, that the boresight of the antenna is oriented towards the main transmission lobe of the far-side link. Upon this determination, the processor 202 may generate an indication that that the fine alignment of the antenna has been achieved. Based on this indication, the speaker 214 may provide audible feedback to the technician. The audio feedback may include, for example, a chime, a beep, a spoken sentence, and or any other type of audio feedback.

In some embodiments, the audio feedback from the speaker 214 may be continuous or nearly continuous. For instance, the speaker 214 may provide a sequence of beeps. The sequence may be slowed down or sped up based on how far the orientation of the antenna is from the main transmission lobe. For example, the sequence may get faster and faster as the boresight of the antenna gets closer and closer to the main transmission lobe of the far side link. Upon reaching the optimal fine alignment position, i.e., the boresight of the antenna being oriented towards the main transmission lobe of the far-side link, the audible feedback may be changed to a continuous signal. The audible feedback described herein are just examples, and any type of audio feedback should be considered within the scope of this disclosure.

The haptic feedback module 216 may provide haptic feedback based on whether the boresight of the antenna is oriented towards the main transmission lobe of the far-side link. For instance, once the fine alignment of the boresight being oriented towards the main transmission lobe is achieved, the haptic feedback module may cause the antenna alignment device or a portion thereof to vibrate and or produce any other type of haptic feedback. It should however be understood that the haptic feedback may not impart any alignment disturbing motion to the antenna.

The communication interface 218 may enable communication between the antenna alignment device and any type of processing device. For example, the communication interface 218 may enable a wireless communication using protocols such as Bluetooth, WiFi, Zigbee, etc. to communicate with a nearby processing device. An example of the nearby processing device may include a mobile device (e.g., smartphone, tablet) being used by the technician. Another example, as discussed above, includes connecting the antenna alignment device to the antenna itself for the purposes of gathering real-time received signal strength measurements via the communications interface 218 as an alternative to translating DC Voltmeter 210 measurements into received signal strength. The communication interface 218 may provide data to the mobile device such that one or more alignment parameters may be displayed by the mobile device. For example, the mobile device may provide an alternative to or replicate the display 212. The communication interface 218 may further enable wired communication between the antenna alignment device and processing devices such as laptop computer, desktop computers and or the antenna. Using the wired communication, alignment parameters and other data may be transferred to the processing devices.

Figure 3:
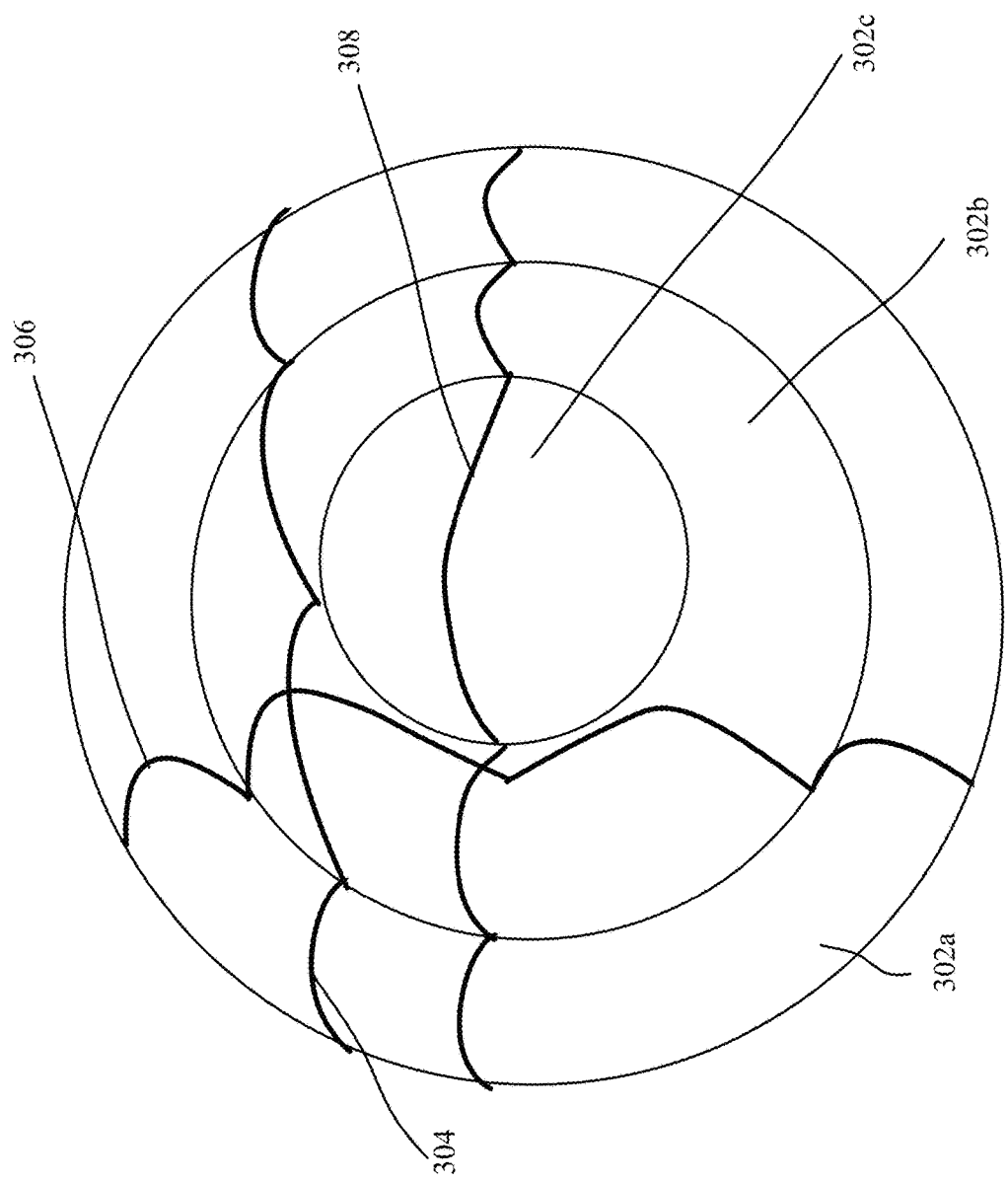
FIG. 3 shows an example transmission pattern of a far side antenna received by the antenna being aligned based on the principles disclosed herein.

FIG. 3 shows an example transmission pattern 300 of a far side antenna received by the antenna being aligned based on the principles disclosed herein. As shown, the transmission pattern 300 has a main lobe 302c and side lobes 302a, 302b. Counting the number of peaks in traversal pathways avoiding the main lobe 302c results in an even number of peaks. For example, in both pathways 304, 306, the number peaks counted is four (even), two for each side lobe 302a, 302b. However, counting the number peaks in a pathway containing the main lobe 302c, the number of peaks is five (odd), two for each side lobe 302a, 302b and one for the main lobe 302c (as shown by pathway 308).

Figure 4:
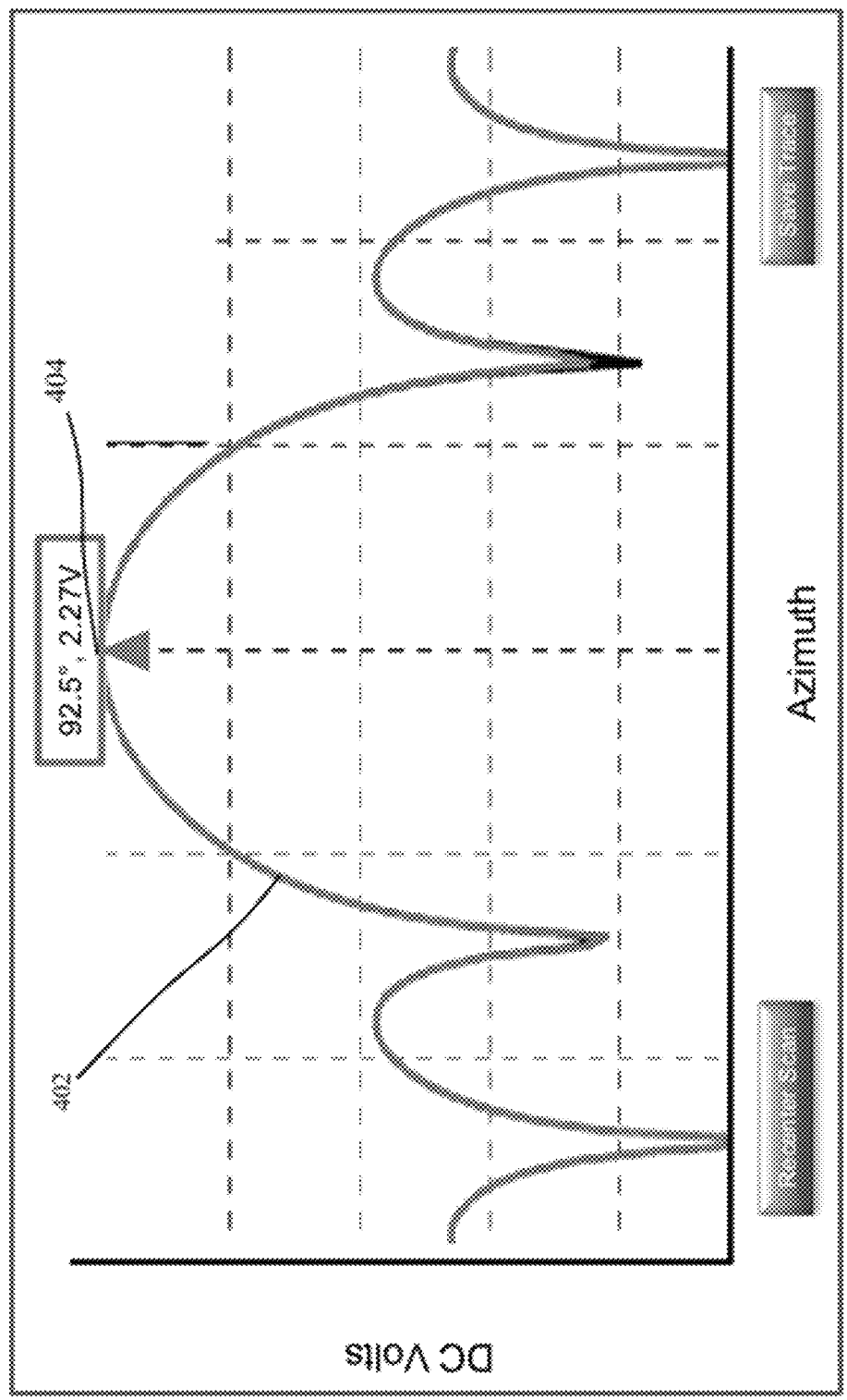
FIG. 4 shows an example interface showing a DC voltage trace, as measured by an antenna alignment device, corresponding to a transmission pattern of a far side antenna, based on the principles disclosed herein.

FIG. 4 shows an example interface 400 showing a DC voltage trace 402, as measured by an antenna alignment device, corresponding to a transmission pattern of a far side antenna, based on the principles disclosed herein. As shown, the DC voltage trace 402 has five peaks with the main peak 404 at 92.5 degrees of azimuth. Using the example interface 400 displayed on an antenna alignment device, the antenna may be finely aligned such that the boresight of the antenna corresponds to the main peak corresponding to the main lobe of the transmission pattern of the far side antenna. The voltage trace 402 may be saved in the antenna alignment device and or an external processing device. A similar trace can be drawn that depicts received signal strength in dBm by converting DC voltage to dBm as per the antenna manufacturers conversion specifications, or by receiving dBm data directly from the antenna (e.g., via the communication interface 218 shown in FIG. 2).

Figure 5:
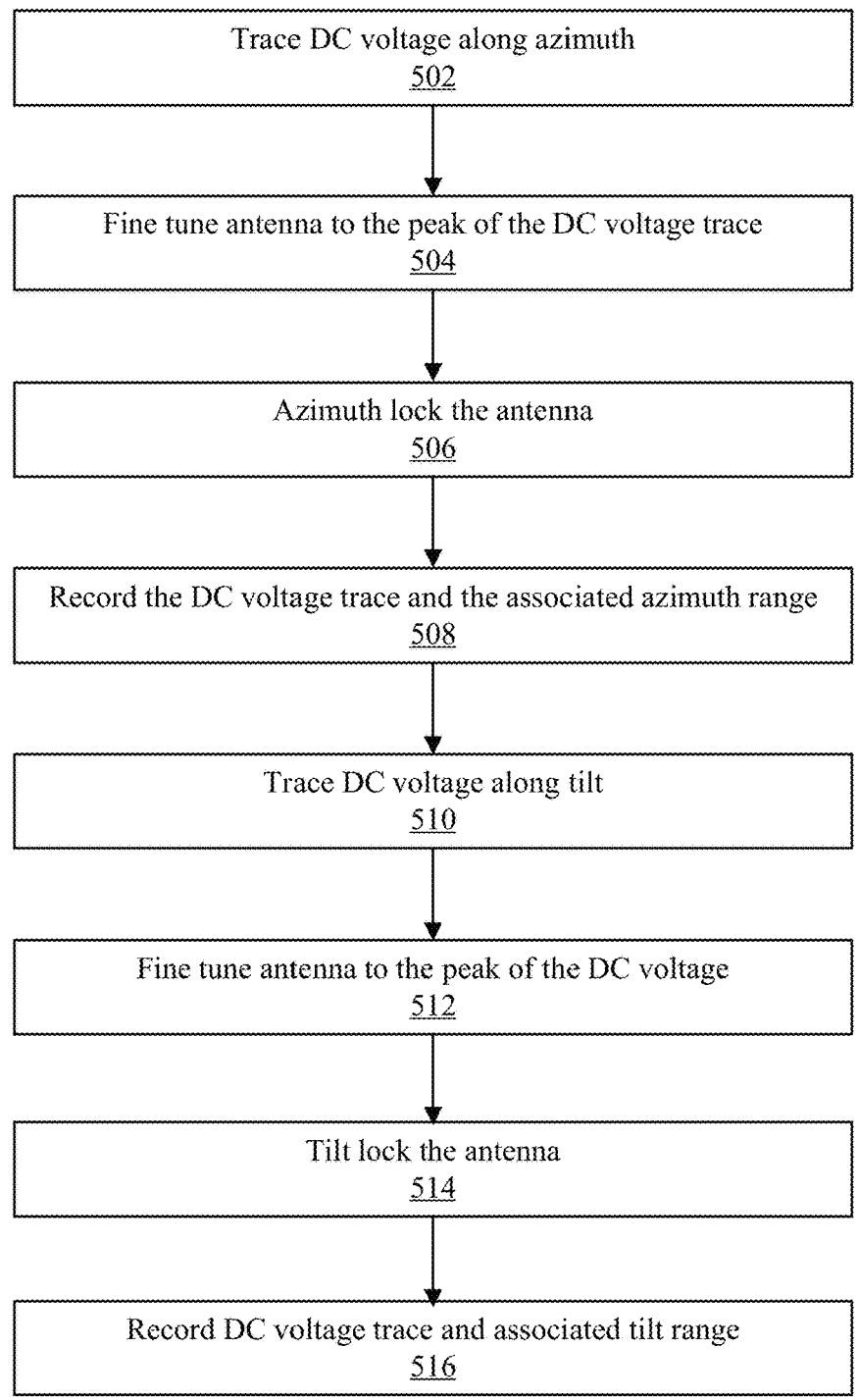
FIG. 5 shows a flow diagram of an example method of finely aligning an antenna based on the principles disclosed herein.

FIG. 5 shows a flow diagram of an example method 500 of fine tuning an antenna, based on the principles disclosed herein. It should, however, be understood that the steps of the method 500 are just examples and should not be considered limiting. That is, methods with additional, alternative, or fewer number of steps should be considered within the scope of this disclosure.

The method 500 may be begin when an antenna alignment device is attached to an antenna and a coarse tuning of the antenna has been performed. The coarse tuning may include tuning (or aligning) the antenna to a desired tilt and or azimuth. The method 500 may then fine tune the antenna such that the antenna is at the peak of the main lobe of a far side transmission link. Particularly, the method 500 may use an embedded DC voltmeter within the antenna alignment device (or a DC voltmeter connected to the antenna alignment device, or by reading received signal strength directly from the antenna via a network connection) to measure the DC voltage indicative of received signal strength at the antenna, and then trace the DC voltage to detect the main lobe and its peak. The DC voltage indicative of the received signal strength at the antenna may be generated by a device attached to the antenna, and the antenna alignment device may connect to the device using two ports to measure/trace the DC voltage.

The method 500 may begin at step 502 where a DC voltage may be traced along the azimuth for the antenna. For instance, the antenna may be set at a particular azimuth based on coarse tuning. Such setting may be done by azimuth bolts. For the fine tuning, the azimuth bolts may be loosened, and the antenna may be slewed to the left stop (e.g., left side boundary line for the fine tuning). The azimuth may be allowed to settle (e.g., using GNSS signals, magnetometers, etc.) and the azimuth value may be recorded for the left stop. The antenna may then be slewed back toward a right stop (e.g., a right-side boundary line for fine tuning) at a moderate pace sufficient to allow the embedded (or connected to the antenna alignment device) DC voltmeter to trace the DC voltage. This tracing may show the radiation pattern of the wireless communication link along an azimuth axis. The displayed tracing may be used to count the number of peaks to confirm that there are an odd number of peaks. Out of the peaks (i.e., odd number of peaks), the highest peak corresponds to the main lobe of the radiation pattern of the wireless communication link.

In some embodiments, the number of peaks may be auto-detected and counted by the antenna alignment device. For example, the antenna alignment device may display a count of the number of peaks and generate an indication when peaks have been detected. For example, if peaks have been detected, the antenna alignment device may generate an audible signal (e.g., a beep). Other examples of the signaling may include visual feedback (e.g., flashing the display, changing a color in the display), haptic feedback, providing a signal to an external processing device, and or any other type of signaling.

At step 504, the antenna may be fine tuned to the peak of the DC voltage trace. To do so, the antenna may be moved back to the center of the main lobe and the trace may be recentered. The antenna may then be dithered back and forth to align with the peak. Recentering the peak may also be done to get to the fine tuning.

At step 506, the antenna may be azimuth locked, once the azimuth fine tuning has been achieved. For this locking, the loosened azimuth bolts (which allowed the flexibility for fine tuning) may be tightened. Upon locking, it may be confirmed that the antenna is locked at the peak of the main lobe of the DC voltage source and has a maximum received signal strength indicator (RSSI) value. At step 508, the DC voltage trace and associated azimuth range may be recorded. The recording may be in any format such as textual format with the critical data points (e.g., boundary, location of the peaks including the peak of the main lobe) and a graphical format visually showing the trace. The recording may also be provided to an external processing device. Regardless of the formatting and location of the storage, the recording may be used to retrieve the fine tuned parameters.

At step 510, the DC voltage may be traced along the tilt of the antenna. For instance, the antenna may be set at a particular tilt based on coarse tuning. Such setting may be done by tilt bolts. For the fine tuning, the tilt bolts may be loosened, and the antenna may be slewed to the bottom (e.g., forming bottom boundary line for the fine tuning). The tilt may be allowed to settle (e.g., using accelerometers, etc.) and the azimuth value may be recorded for the bottom stop. The antenna may be slewed back toward a top stop (e.g., a top boundary line for fine tuning) at a moderate pace sufficient to allow the embedded (or connected) DC voltmeter to trace the DC voltage indicative of the received signal strength at the antenna. This tracing may show the radiation pattern of the wireless communication link along a tilt axis. The displayed tracing may be used to count the number of peaks to confirm that there are odd number of peaks. Out of the peaks (i.e., odd number of peaks), the highest peak corresponds to the main lobe of the radiation pattern of the wireless communication link.

In some embodiments, the peaks may be auto-detected and counted by the antenna alignment device. For example, the antenna alignment device may display a count of the number of peaks and generate an indication of whether peaks have been detected. For example, when peaks are detected, the antenna alignment device may generate an audible signal (e.g., a beep). Other examples of the signaling may include visual feedback (e.g., flashing the display, changing a color in the display), haptic feedback, signal to an external processing device, and or any other type of signaling.

At step 512, the antenna may be fine tuned to the peak of the DC voltage trace. To do so, the antenna may be moved back to the center of the main lobe and the trace may be recentered. The antenna may then be dithered back and forth (i.e., to fine tune the tilt) to align with the peak. Recentering the peak may also be done to get to the fine tuning.

At step 514, the antenna may be tilt locked, once the tilt fine tuning has been achieved. For this locking, the loosened tilt bolts (which allowed the flexibility for fine tuning) may be tightened. Upon locking, it may be confirmed at the antenna is locked at the peak of the main lobe of the DC voltage source and has a maximum RSSI value. At step 516, the DC voltage trace and associated tilt range may be recorded. The recording may be in any format such as textual format with the critical data points (e.g., boundary, location of the peaks including the peak of the main lobe) and a graphical format visually showing the trace. The recording may also be provided to an external processing device. Regardless of the formatting and location of the storage, the recording may be used to retrieve the fine tuned parameters for the tilt.

Figure 6:
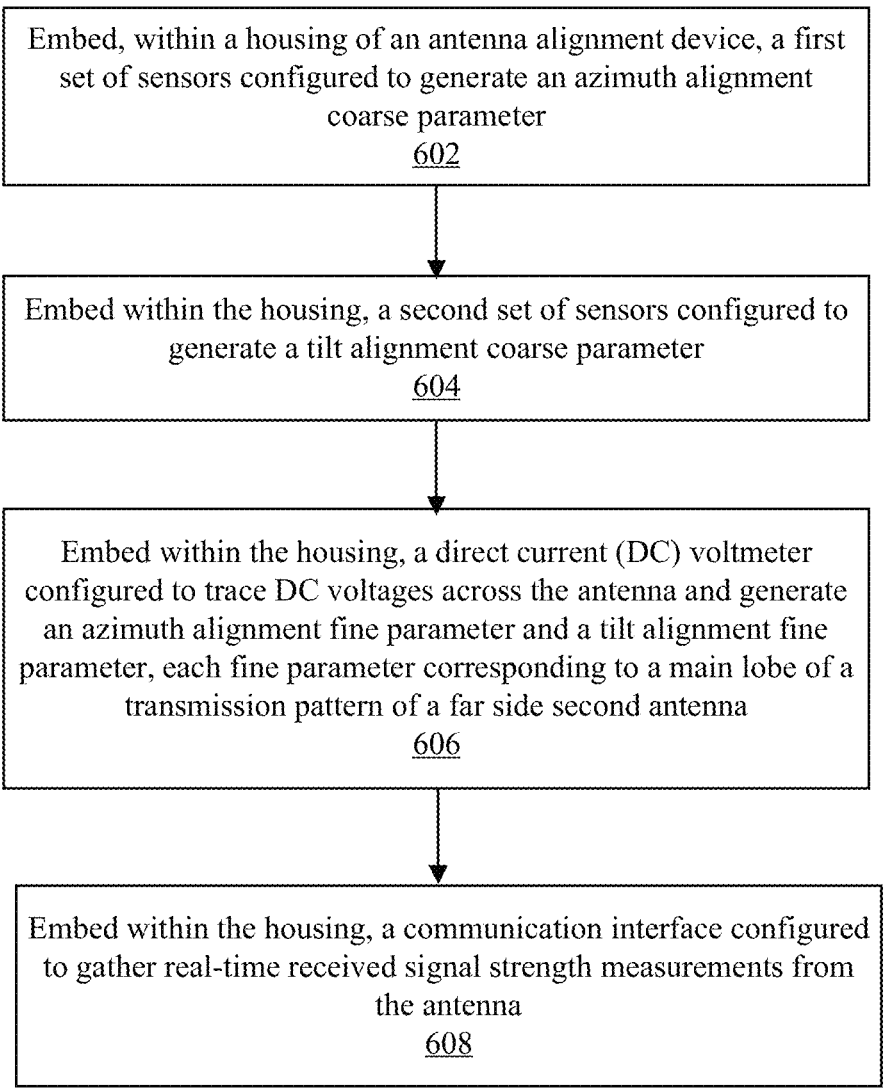
FIG. 6 shows a flow diagram of an example method of manufacturing an antenna alignment device based on the principles disclosed herein.

FIG. 6 shows a flow diagram of an example method 600 of manufacturing an antenna alignment device based on the principles disclosed herein. It should, however, be understood that the steps of the method 600 are just examples and should not be considered limiting. That is, methods with additional, alternative, or fewer number of steps should be considered within the scope of this disclosure.

The method 600 begin at step 602 where a first set of sensors configured to generate an azimuth alignment coarse parameter may be embedded within a housing of the antenna alignment device. The first set of sensors may include, for example, GNSS sensors and or magnetic field sensors. At step 604 a second set of sensors configured to generate a tilt alignment coarse parameter may be embedded within the housing. The second set of sensors may include, for example, accelerometers. At step 606, a direct current (DC) voltmeter configured to trace DC voltages indicative of the received signal strength at the antenna may be embedded within the housing. The DC voltmeter may generate an azimuth alignment fine parameter and a tilt alignment fine parameter, each fine parameter corresponding to a main lobe of a transmission pattern of a far side second antenna. At step 608, a communication interface may be embedded to the housing. The communication interface may gather received signal strength in real time from the antenna being aligned. The real-time received signal strength may be used as an alternative to (or as an addition to) the DC voltmeter for signal strength measurements when aligning the antenna.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. An antenna alignment device configured to be coupled to an antenna for aligning the antenna, the antenna alignment device comprising:
   a first set of sensors configured to generate an azimuth alignment coarse parameter;
   a second set of sensors configured to generate a tilt alignment coarse parameter;
   a direct current (DC) voltmeter configured to trace DC voltages indicative of a received signal strength at the antenna and generate an azimuth alignment fine parameter and a tilt alignment fine parameter; and
   the antenna alignment device configured to:
      detect one or more peaks in the traced DC voltages;
      count a number of the detected one or more peaks; and
      determine that a boresight of the antenna is oriented toward a main lobe of a transmission pattern of a far side second antenna responsive to the counted number being odd.

2. The antenna alignment device of claim 1, wherein each fine parameter corresponds to the main lobe of the transmission pattern of the far side second antenna.

3. The antenna alignment device of claim 1, wherein the antenna comprises a microwave antenna.

4. The antenna alignment device of claim 1, further comprising:
   a display device configured to display the traced DC voltages.

5. The antenna alignment device of claim 1, wherein:
   the traced DC voltages comprise traced DC voltages in an azimuth axis; and
   the azimuth alignment fine parameter comprises at least one of:
      an azimuth range of the traced DC voltages; and
      an azimuth corresponding to the main lobe peak of the transmission pattern of the far side second antenna.

6. The antenna alignment device of claim 1, wherein:
   the traced DC voltages comprise traced DC voltages in a tilt axis;
   the tilt alignment fine parameter comprises at least one of:
   a tilt range of the traced DC voltages; and
   a tilt corresponding to the main lobe peak of the transmission pattern of the far side second antenna.

7. The antenna alignment device of claim 1, wherein the antenna alignment device is configured to store the traced DC voltages, the azimuth alignment fine parameter, and the tilt alignment fine parameter.

8. The antenna alignment device of claim 1, wherein the antenna alignment device is configured to transmit the traced DC voltages, the azimuth alignment fine parameter, and the tilt alignment fine parameter to an external processing device.

9. The antenna alignment device of claim 1, wherein the antenna alignment device is configured to generate an audible signal corresponding to the detected one or more peaks in the traced DC voltages.

10. The antenna alignment device of claim 9, wherein the antenna alignment device is configured to generate a continuous audible signal upon determining that the boresight of the antenna is oriented toward the main lobe of the transmission pattern of the far side second antenna.

11. The antenna alignment device of claim 1, wherein the antenna alignment device is configured to generate indications corresponding to the detected one or more peaks.

12. A method of aligning an antenna with an antenna alignment device, the method comprising:
   coarsely aligning an azimuth of the antenna using a first set of sensors in the antenna alignment device;
   coarsely aligning a tilt of the antenna using a second set of sensors in the antenna alignment device;
   finely aligning the azimuth and the tilt using a direct current (DC) voltmeter that traces DC voltages indicative of a received signal strength at the antenna and generate an azimuth alignment fine parameter and a tilt alignment fine parameter;
   detecting one or more peaks in the traced DC voltages;
   counting a number of the detected one or more peaks; and
   determining that a boresight of the antenna is oriented toward a main lobe of a transmission pattern of a far side second antenna responsive to the counted number being odd.

13. The method of claim 12, wherein each fine parameter corresponds to the main lobe of the transmission pattern of the far side second antenna.

14. The method of claim 12, wherein:
the traced DC voltages comprise traced DC voltages in an azimuth axis;
the azimuth alignment fine parameter comprises at least one of:
an azimuth range of the traced DC voltages; and
an azimuth corresponding to the main lobe peak of the transmission pattern of the far side second antenna.

15. The method of claim 12, wherein:
the traced DC voltages comprise traced DC voltages in a tilt axis;
the tilt alignment fine parameter comprises at least one of:
a tilt range of the traced DC voltages; and
a tilt corresponding to the main lobe peak of the transmission pattern of the far side second antenna.

16. The method of claim 12, further comprising:
storing the traced DC voltages, the azimuth alignment fine parameter, and the tilt alignment fine parameter.

17. The method of claim 12, further comprising:
transmitting the traced DC voltages, the azimuth alignment fine parameter, and the tilt alignment fine parameter to an external processing device.

18. The method of claim 12, further comprising:
generating an audible signal corresponding to the detected one or more peaks in the traced DC voltages; and
generating a continuous audible signal upon determining that the boresight of the antenna is oriented toward the main lobe of the transmission pattern of the far side second antenna.

19. An antenna alignment system comprising:
an antenna alignment device comprising:
a first set of sensors configured to generate an azimuth alignment coarse parameter;
a second set of sensors configured to generate a tilt alignment coarse parameter;
a direct current (DC) voltmeter configured to:
measure DC voltages indicative of a received signal strength at the antenna;
wherein the antenna alignment device is configured to:
receive the measured DC voltages from the DC voltmeter;
generate an azimuth alignment fine parameter and a tilt alignment fine parameter based on the measured DC voltages;
detect one or more peaks in the measured DC voltages;
count a number of the detected one or more peaks; and
determine that a boresight of the antenna is oriented toward a main lobe of a transmission pattern of far side second antenna responsive to the counted number being odd.

20. The antenna alignment system of claim 19, wherein the antenna alignment device is configured to receive the measured DC voltages through a wireless communication protocol.

* * * * *